United States Patent
Tai et al.

(10) Patent No.: US 6,903,389 B1
(45) Date of Patent: Jun. 7, 2005

(54) VARIABLE LAYOUT DESIGN FOR MULTIPLE VOLTAGE APPLICATIONS

(75) Inventors: Chun-Hui Tai, Hsin-Chu (TW); Li-Chun Tien, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/868,606

(22) Filed: Jun. 15, 2004

(51) Int. Cl.[7] .............................................. H01L 27/10
(52) U.S. Cl. ...................................... 257/202; 257/203
(58) Field of Search ......................... 257/202–211, 355, 257/903–904

(56) References Cited

U.S. PATENT DOCUMENTS

2004/0251501 A1 * 12/2004 Catalasan et al. ........... 257/355

OTHER PUBLICATIONS

Kakerow, R., "Low Power Design Methodologies for Mobile Communication," Proceedings of the 2002 IEEE International Conference on Computer Design: VLSI Computers and Processors (2002) 6 pages.

PURI, R., et al., "Pushing ASIC Performance in a Power Envelope," DAC, Anaheim, CA (Jun. 2–6, 2003) pp. 788–793.

Usami, K., et al., "Low–Power Design Methodology and Applications Utilizing Dual Supply Voltages," Proceedings of the Design Automation Conference (Jan. 2000) pp. 123–128.

* cited by examiner

*Primary Examiner*—Cuong Nguyen
(74) *Attorney, Agent, or Firm*—Slater & Matsil, L.L.P.

(57) ABSTRACT

An integrated circuit it comprises a logic cell. The logic cell is without nwell contacts and comprises top and bottom voltage supply wires. The integrated circuit also comprises a first filler cell comprising top and d bottom voltage supply wires and an nwell region coupled to the bottom voltage supply wire. The integrated circuit further comprises a second filler cell with an nwell region coupled to a top voltage supply wire. The integrated circuit still further comprises a third filler cell comprising top and bottom voltage supply wires. The third filler cell also comprising a pair of nwell regions. One of nwell regions is coupled to the top voltage supply wire and the other nwell region is coupled to the bottom voltage supply wire. The standard cell and the filler cells each comprise a PRboundary overlapping a top portion of the nwell region in each cell by a first distance.

13 Claims, 9 Drawing Sheets

VARIABLE LAYOUT DESIGN FOR MULTIPLE VOLTAGE APPLICATIONS

CROSS-REFERENCE TO RELATED APPLICATIONS

This application relates to the following co-pending and commonly assigned patent application: Ser. No. 60/566,041, filed Apr. 28, 2004, entitled "Very Fine-Grain Voltage Island Integrated Circuit," which application is hereby incorporated herein by reference.

TECHNICAL FIELD

The present invention relates generally to a system and method for semiconductor devices, and more particularly to a system and method for a variable layout design for multiple voltage applications.

BACKGROUND

The rising popularity of electronic devices such as mobile applications has created a need for power conservation in integrated circuits. The macro-based dual-VDD structure 100 in FIG. 1a proposed by R. Puri, et al. in a paper entitled "Pushing ASIC Performance in a Power Envelope," published in pp. 788–793 of DAC, 2003, illustrates a known coarse-grained voltage island architecture with macro-based voltage islands 102. A finer grained voltage island circuits include the voltage island circuit of FIG. 1b as described by Usami et al. in a paper entitled "Low-Power Design Methodology and Applications Utilizing Dual Supply Voltages," in pp. 123–128 of the Proceedings of the Design Automation Conference, 2000, Asia and South Pacific, 25–28 Jan. 2000, and incorporated by reference herein. Other known voltage island circuits may use the layout scheme shown in FIGS. 1c and 1d and disclosed by Ralf Kakerow in a paper entitled "Low Power Design Methodology for Mobile Communication," published in pp. 8–13 of entitled "Low Power Design Methodology for Mobile Communication," published in pp. 8–13 of Computer Design: Proceedings of the 2002 IEEE International Conference On VLSI in Computer and Processors, 2002, and incorporated by reference herein.

However, the designs described above suffer from chip area spacing penalties, in addition to complications in the place and route process. Complications may include dense interconnect and long wire routes, causing antenna violations, capacitive parisitics, and other problem. Restriction in localized and global placement and routing, imposed by known dual voltage designs, impede the iterative IC timing convergence process. The IC timing convergence process, including various stages of placement and routing, has a need for simple manufacture methods that provide a high level of control to the designer. Complications in the place and route may delay time to market and may negatively affect circuit timing convergence.

SUMMARY OF THE INVENTION

These and other problems are generally solved or circumvented, and technical advantages are generally achieved, by illustrative embodiments of the present invention which provide a variable layout design for multiple voltage applications.

In accordance with an illustrative embodiment of the present invention, an integrated circuit comprises a logic cell. The logic cell is without nwell contacts and comprises top and bottom voltage supply wires. The integrated circuit also comprises a first filler cell comprising top and bottom voltage supply wires and an nwell region coupled to the bottom voltage supply wire. The integrated circuit further comprises a second filler cell with an nwell region coupled to a top voltage supply wire. The integrated circuit still further comprises a third filler cell comprising top and bottom voltage supply wires. The third filler cell also comprises a pair of nwell regions. One of nwell regions is coupled to the top voltage supply wire and the other nwell region is coupled to the bottom voltage supply wire. The standard cell and the filler cells each comprise a PRboundary overlapping a top portion of the nwell region in each cell by a first distance.

In accordance with another illustrative embodiment of the present invention, a standard cell library comprises a standard cell. The standard cell comprises first and second voltage supply wires in a top portion of the standard cell. The standard cell further comprises, an nwell region, the edge of which is separated from a top edge of a place and route boundary (PRboundary) by a first distance. The nwell region of the standard cell is not contacted with the first or the second voltage supply wires. The standard cell also comprises a first filler cell. The first filler cell comprises first and second voltage supply wires in a top portion of the first filler cell. The first filler cell further comprises an nwell region coupled to the first voltage supply wire. The standard cell library still further comprises a second filler cell. The second filler cell comprises a voltage supply wire in a top portion of the second filler cell and an nwell region. coupled to the voltage supply wire. The standard cell still further comprises a third filler cell. The third filler cell comprises first and second voltage supply wires in a top portion of the second filler cell. The third filler cell also comprises first and second nwell regions horizontally separated by a second distance. The first nwell region is coupled to the first voltage supply wire, and the second nwell region is coupled to the second voltage supply wire.

In accordance with yet another illustrative embodiment of the present invention, a standard cell library comprises a standard cell. The standard cell comprises a first place and route boundary (PRboundary). The standard cell also comprises a first voltage supply wire. The first voltage wire has a longitudinal center substantially aligned with a top edge of the first PRboundary. The standard cell further comprises a second voltage supply wire inside the first PRboundary. The second voltage supply wire is aligned with the first supply wire in a top portion of the standard cell. The standard cell still further comprises a first nwell region having a top edge separated from a top edge of the first PRboundary by half of an nwell spacing design rule. The first nwell region is not coupled to the first or the second voltage supply wires. The standard cell library also includes a first filler cell. The first filler cell comprises a second PRboundary and a third and fourth voltage supply wires. The second PRboundary and third and fourth voltage supply wires are configured substantially the same as the first PRboundary and the first and second voltage supply wires, respectively. The first filler cell also comprises a second nwell region coupled to the fourth voltage supply wire. The second nwell region has a top edge separated from the top edge of the third PRboundary by the first distance. The first filler cell further comprises a first power contact wire two layers of metal above the third and fourth voltage supply wires. The fourth voltage supply wire is coupled to the power contact wire. The standard library further comprises a second filler cell. The second filler cell further comprises a third PRboundary and a fifth voltage supply wire. The longitudinal center of the fifth voltage supply wire is substantially aligned with a top edge of the third PRboundary. The second filler cell still further comprises a third nwell region coupled to the fifth voltage supply wire. The third nwell region has a top edge separated from the top edge of the third PRboundary by half of the nwell spacing design rule. The standard library still further comprises a third filler cell. The third filler cell comprises a fourth PRboundary, a sixth and a seventh voltage supply wire. The longitudinal center of the sixth voltage supply wire is substantially aligned with a top edge of the fourth PRboundary. The third filler cell also comprises fourth and fifth nwell regions horizontally separated by the nwell spacing design rule. The fourth and fifth nwell regions have a top edge separated from the top edge of the fourth PRboundary by half of the nwell spacing design rule. The fourth nwell region is coupled to the sixth voltage supply wire and the fifth nwell region is coupled to the seventh voltage supply wire.

BRIEF DESCRIPTION OF THE DRAWINGS

For more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently illustrative embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely a variable layout design for multiple voltage applications. The method includes the formation of a dual voltage standard cell library comprising dual voltage standard cells. The types of dual voltage standard cells include at least three types of dual voltage filler cells and a multiplicity of dual voltage logic cells. Logic cells are cells having Boolean and state machine functionality such as a NAND cell, a NOR cell, an inverter cell, or a latch, for example. Similarly, filler cells in illustrative embodiments of the present invention fulfill the traditional role of known filler cells in addition to providing additional features to the integrated circuit manufacturing process. A method of manufacturing a dual voltage standard cell library in accordance with a first illustrative embodiment of the present invention, is shown in FIGS. 2a–2f.

Figure 1A:
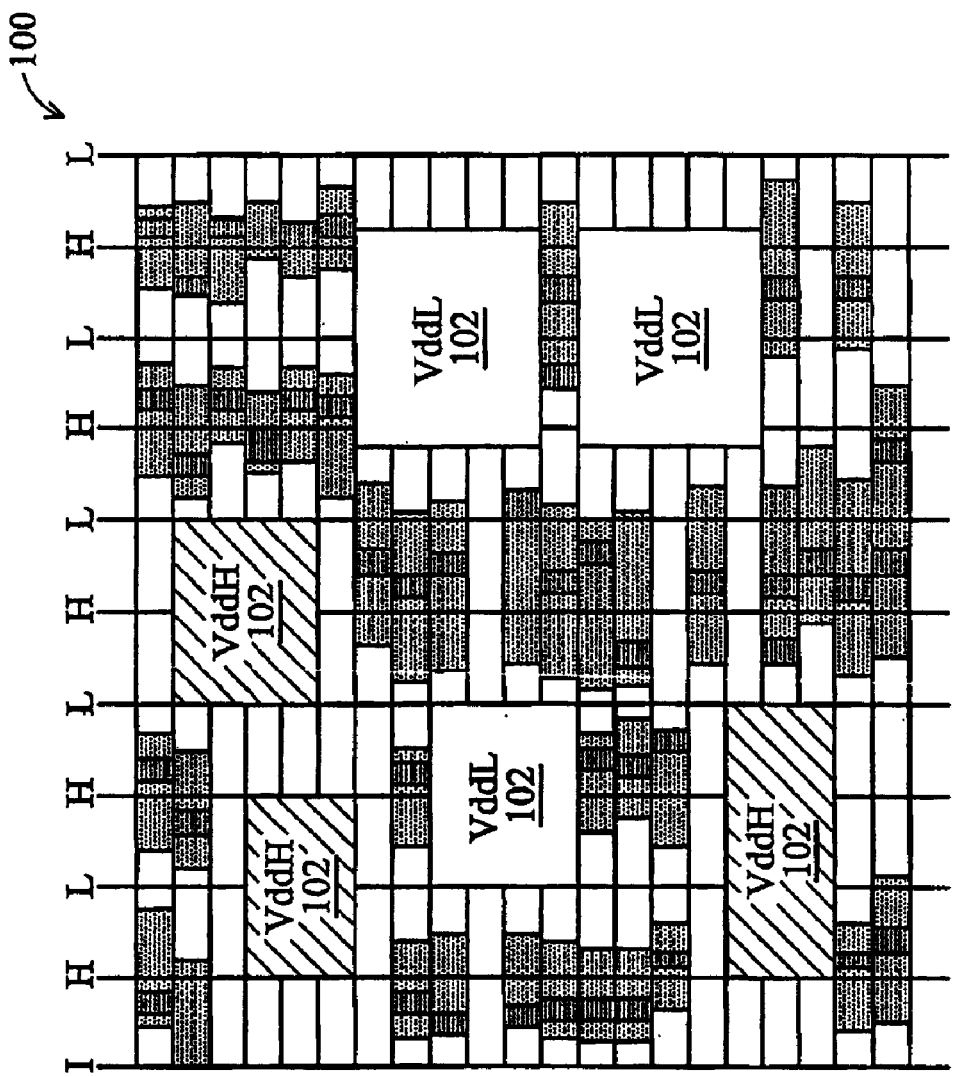
FIGS. 1a–1d show known voltage island integrated circuits.
Figure 1B:
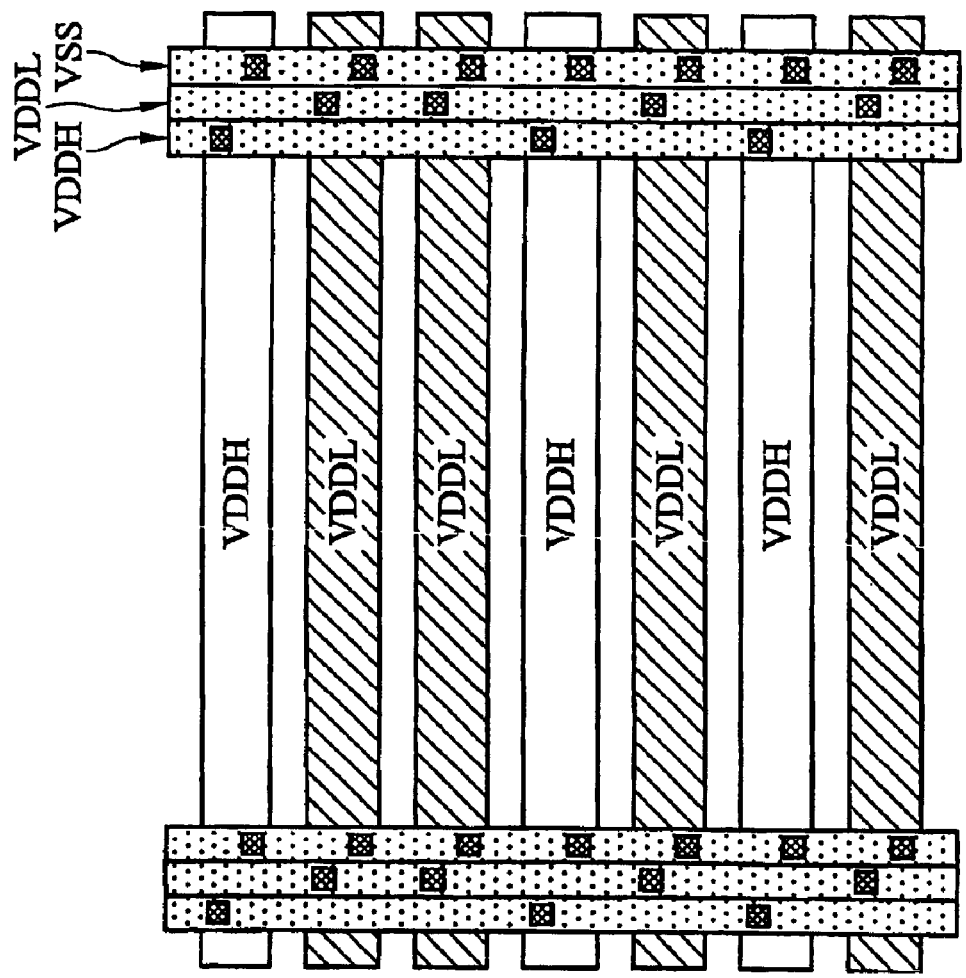
Figure 1C:
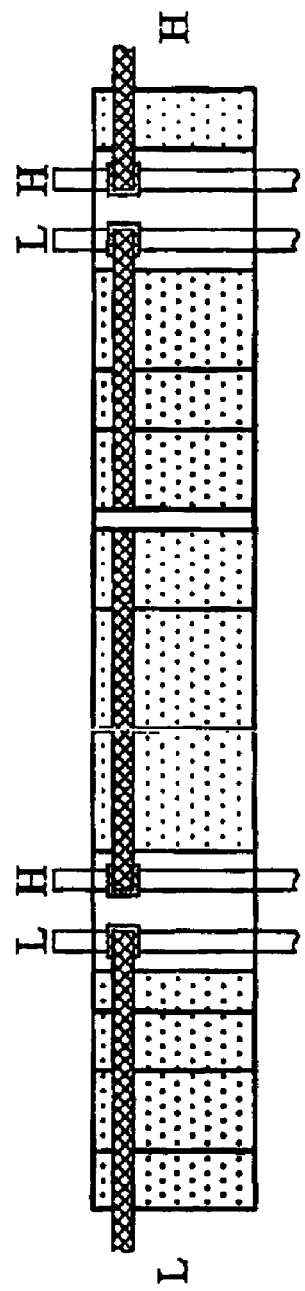
Figure 1D:
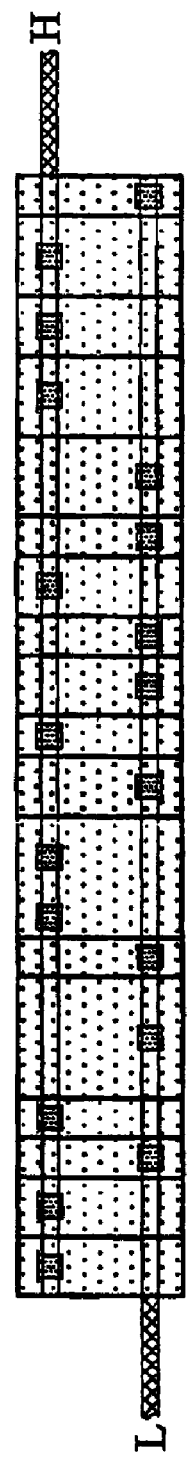
Figure 2A:
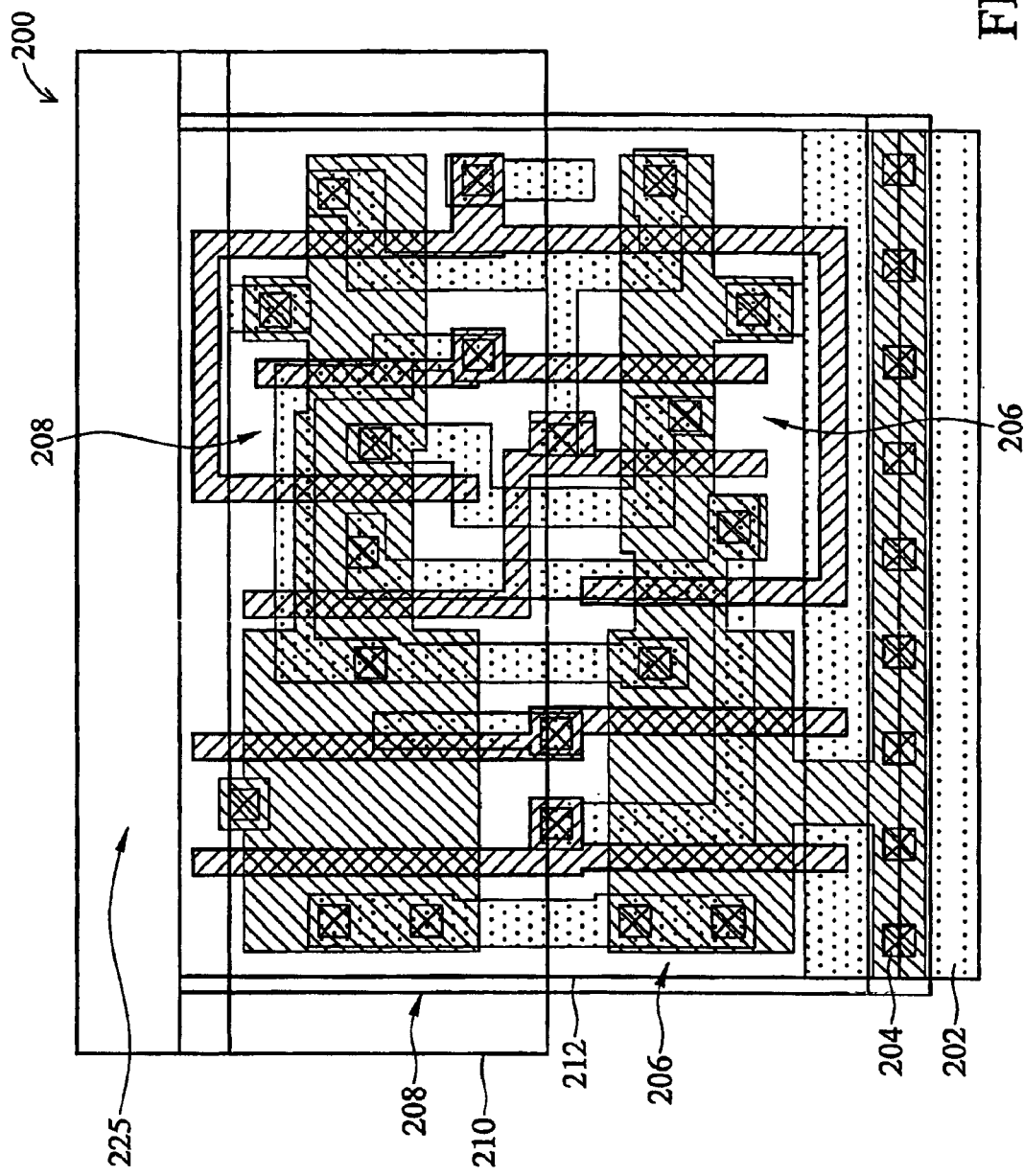
FIGS. 2a–2f show a method of manufacturing a first illustrative embodiment in accordance with the present invention.
Figure 2B:
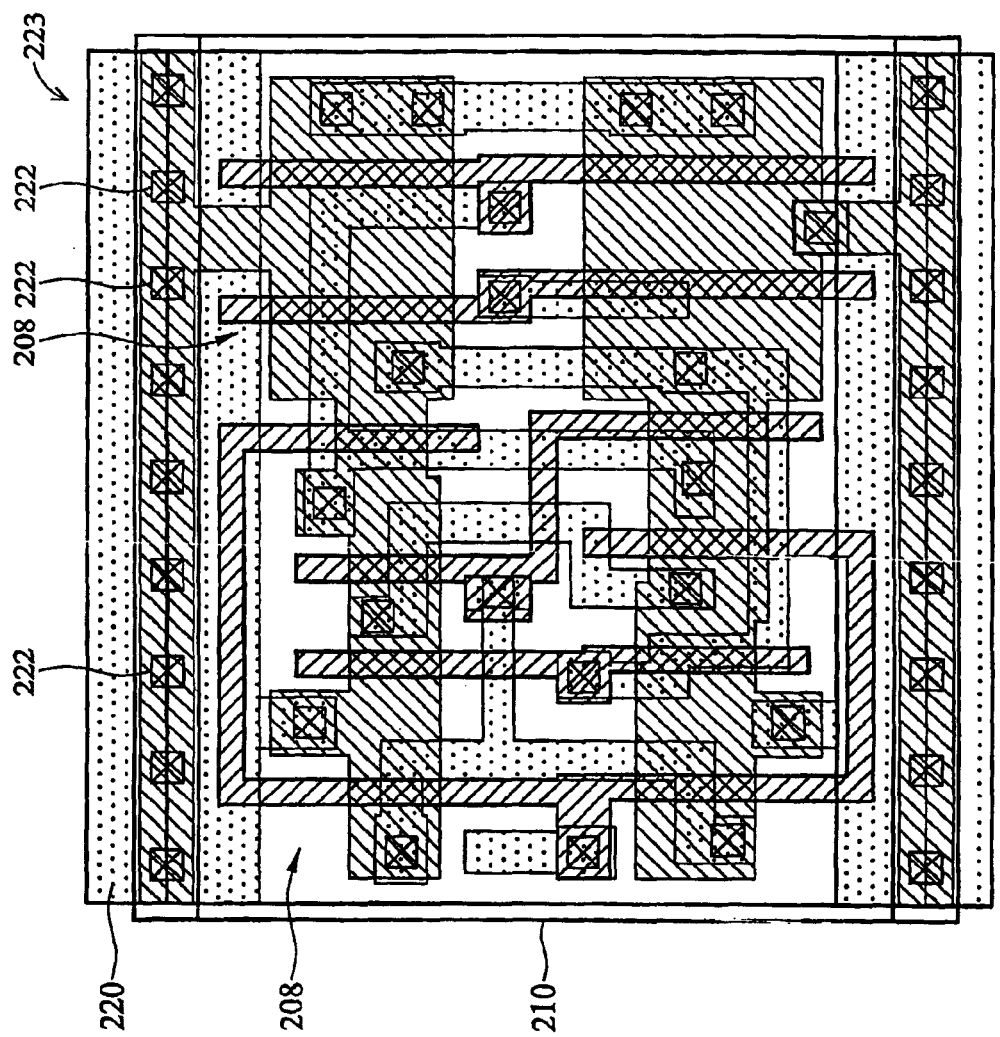

A first step in the formation of a dual voltage logic cell is the formation of a base portion of the logic cell. The base portion may be the result of modifying an existing single or dual voltage standard logic cell, or may be formed from scratch. A base portion of a dual-voltage standard cell 200 is shown in FIG. 2a. The base portion of the standard cell 200 includes a ground rail 202 coupled to p-diffusion contacts 204, NMOS circuitry 206, PMOS circuitry 208 in an nwell 210, and a place and route boundary (PRboundary) 212, as shown in FIG. 2a. It should be noted that the area of the nwell 2 10 is minimized to overlap the PMOS devices 208 with minimum overlap.

An advantageous feature of the illustrative embodiments of the present invention is the ability to adapt an existing single or dual voltage standard logic cell to a preferred dual voltage standard cell library with minimal complexity using steps that are suitable for automation. For example, the base portion of the dual voltage standard cell 200 shown in FIG. 2a, may also be the result of modifying an existing single voltage standard cell. For example, the single voltage standard cell 223 shown in FIG. 2b may be transformed into the base portion of the dual voltage standard cell of FIG. 2a through several steps. A first step includes the removal of the power wire 220 and nwell contacts 222. The nwell region 210 is then minimized to overlap the PMOS devices 208 with a minimum overlap. These steps will convert the single voltage standard cell 223 into the base portion of the dual voltage standard cell 200 shown in FIG. 2a.

Figure 2C:
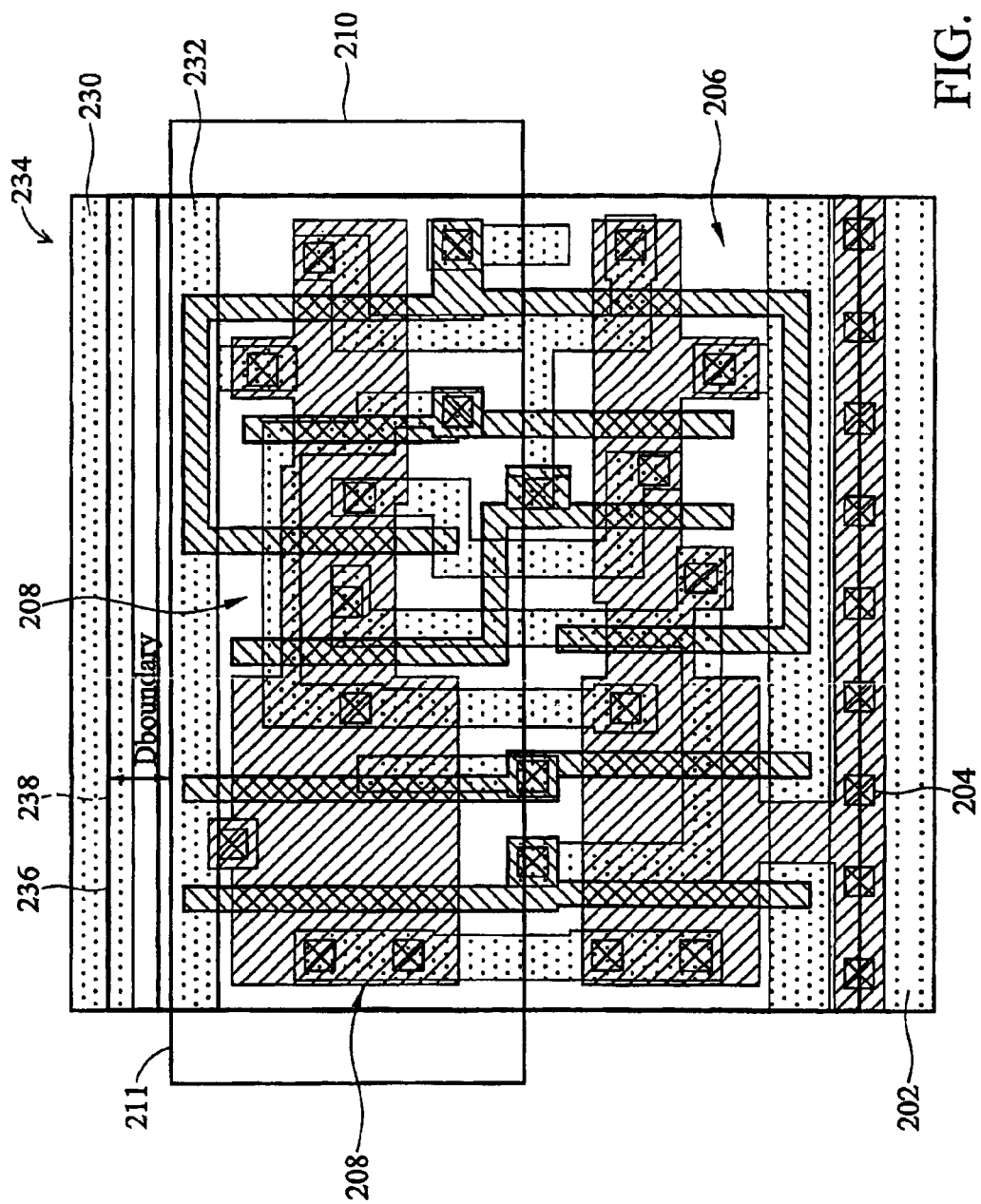

Referring to FIGS. 2a and 2c, the two metal 1 parallel voltage supply wires 230 and 232 shown in FIG. 2c are placed in the top portion 225 of the base standard cell 200 shown in FIG. 2a. The resulting dual voltage standard logic cell 234 is shown in FIG. 2c. The top edge of the PRboundary 236 is substantially aligned with the longitudinal center of the top voltage supply wire 238. The top edge of the PRboundary 236 and the top edge of the nwell region 211 are separated by a distance $D_{boundary}$ of about 0.4 um. The distance $D_{boundary}$ is alternatively about half of the nwell spacing distance ($D_{nwell}$) of the specified by the design rules of the semiconductor manufacturing process for which the standard cell library is designed.

The dual voltage standard cell library of the present invention may have any number of logic cells having a similar structure as the logic cell 234 in FIG. 2c, with the exception of the interconnected circuitry. For example, a second dual voltage standard logic cell in the dual voltage standard cell library of the first illustrative embodiment may have a structure similar to the logic cell 234 shown in FIG. 2c. However, the PMOS and NMOS devices in the second logic cell, and the interconnecting circuitry between the PMOS and NMOS devices in the second logic cell, are substantially different than the configuration of PMOS 208 and NMOS 206 logic cells in the logic cell 234 of FIG. 2c.

Figure 2E:
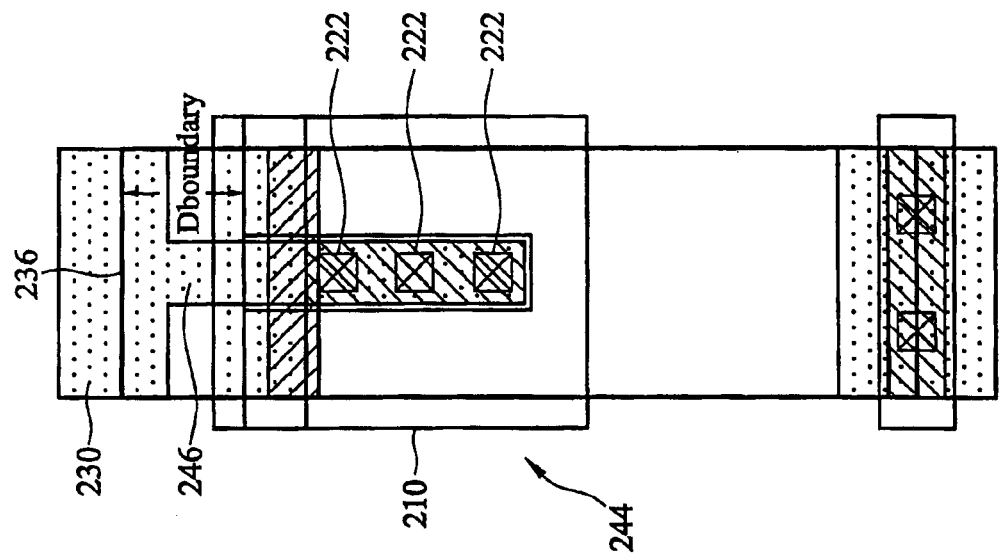
Figure 2D:
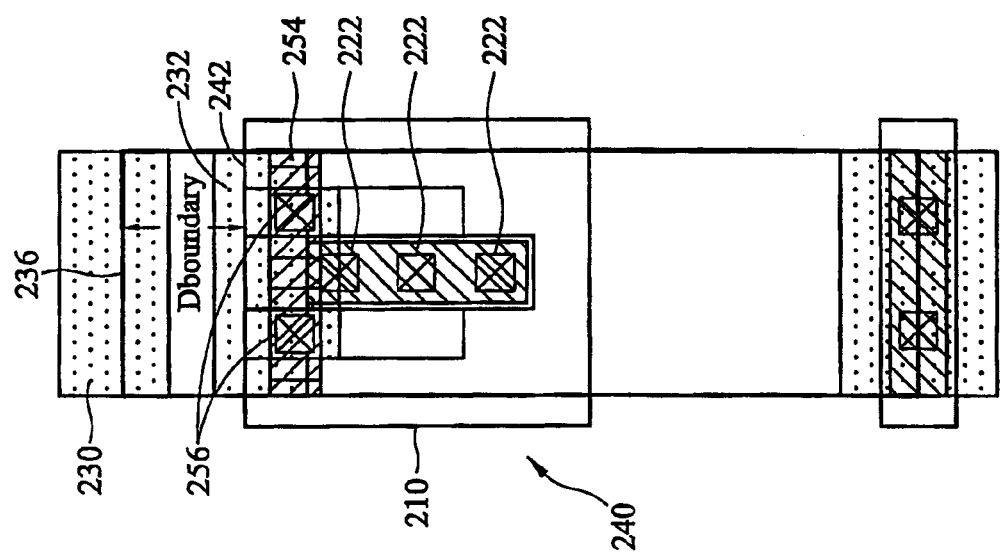
Figure 2F:
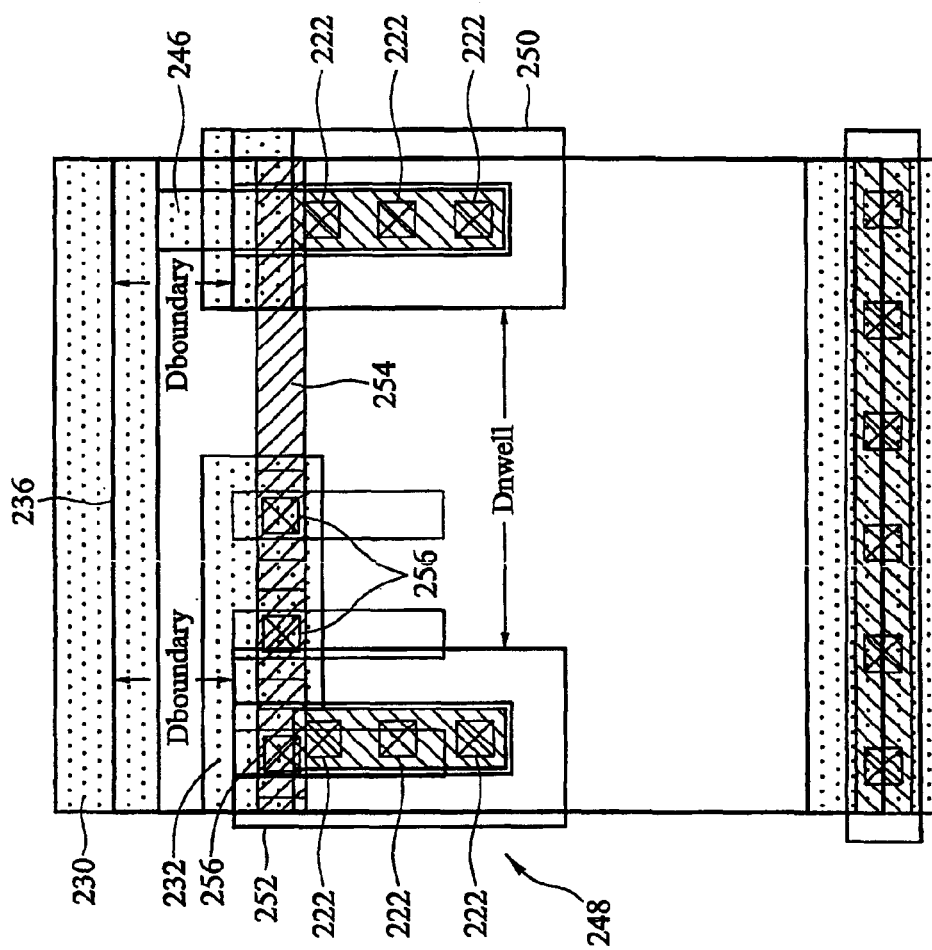

In accordance with standard cell library design methodology, the present invention also includes filler cells. However, in contrast to common filler cells, filler cells of the present invention are the exclusive providers of backgate voltage bias to the PMOS devices in the logic cells of the dual voltage standard cell library. A method of manufacturing the dual voltage filler cells of the present illustrative embodiment is shown in FIGS. 2d–2f. Providing selective voltage to the nwell regions of the logic cells requires three types of filler cell layouts. A first filler low (L) cell 240, shown in FIG. 2d, has nwell contacts 222 coupled to the bottom voltage supply wire 242. A second filler high (H) cell 244, shown in FIG. 2e, has nwell contacts 222 coupled to the top voltage supply wire 230. In addition, the filler H cell 244 lacks a lower voltage supply wire in order to accommodate a metal 1 lead 246 from the top voltage supply wire 230 over the nwell contacts 222. A third filler high/low (H/L) cell 248, shown in FIG. 2f, has two nwell regions 250 and 252, horizontally separated by the distance $D_{nwell}$. The first nwell 252 is coupled to the bottom voltage supply wire 232 and the second nwell 250 is coupled to the top voltage supply wire 230.

The metal 1 bottom voltage supply wire 232 in the filler L cell 240 and filler H/L cell 248 is coupled to a metal 3 power contact wire 254 by several vias 256. Alternatively, the power contact wires 254 may be formed two metal layers above the bottom voltage supply wire 232 metal layer. For example, if the bottom voltage supply wire 232 is formed in metal 2, the power contact wires 254 in the filler L cell 240 and filler H/L cell 248 are preferably in metal 4. Although the vertical separation of the bottom voltage supply wire 232 and the low power contact wire 254 is preferably two levels of metal, the power contact wires 254 may be at any vertical distance above the bottom voltage supply wire 232.

The standard cell libraries in illustrative embodiments of the present invention abide by generally accepted standard cell design methodologies to the extent that they do not depart from the spirit and scope of the invention. For example, standard cell design methodologies include the requirement that each cell in a standard cell library have fixed placement and fixed separation of various cell elements. In accordance with this requirement, note that the top edge of the nwell regions 210, 250, and 252 of the logic cell 234 and the filler cells 240, 244, and 248, are all separated from the top edge of the PRboundary 236 by the same distance $D_{boundary}$.

An advantageous feature of illustrative embodiments designed in accordance with standard cell methodologies is the flexibility to use suitable industry accepted place and route tools such as Cadence Silicon Ensemble. Place and route tools are significantly faster and provide more flexibility and control in the place and route process than other techniques such as custom routing. As an alternative to using industry tools, proprietary tools may also be used with standard cell libraries. Custom placement and routing is preferably reserved for time, power or spacing critical circuits.

Figure 3:
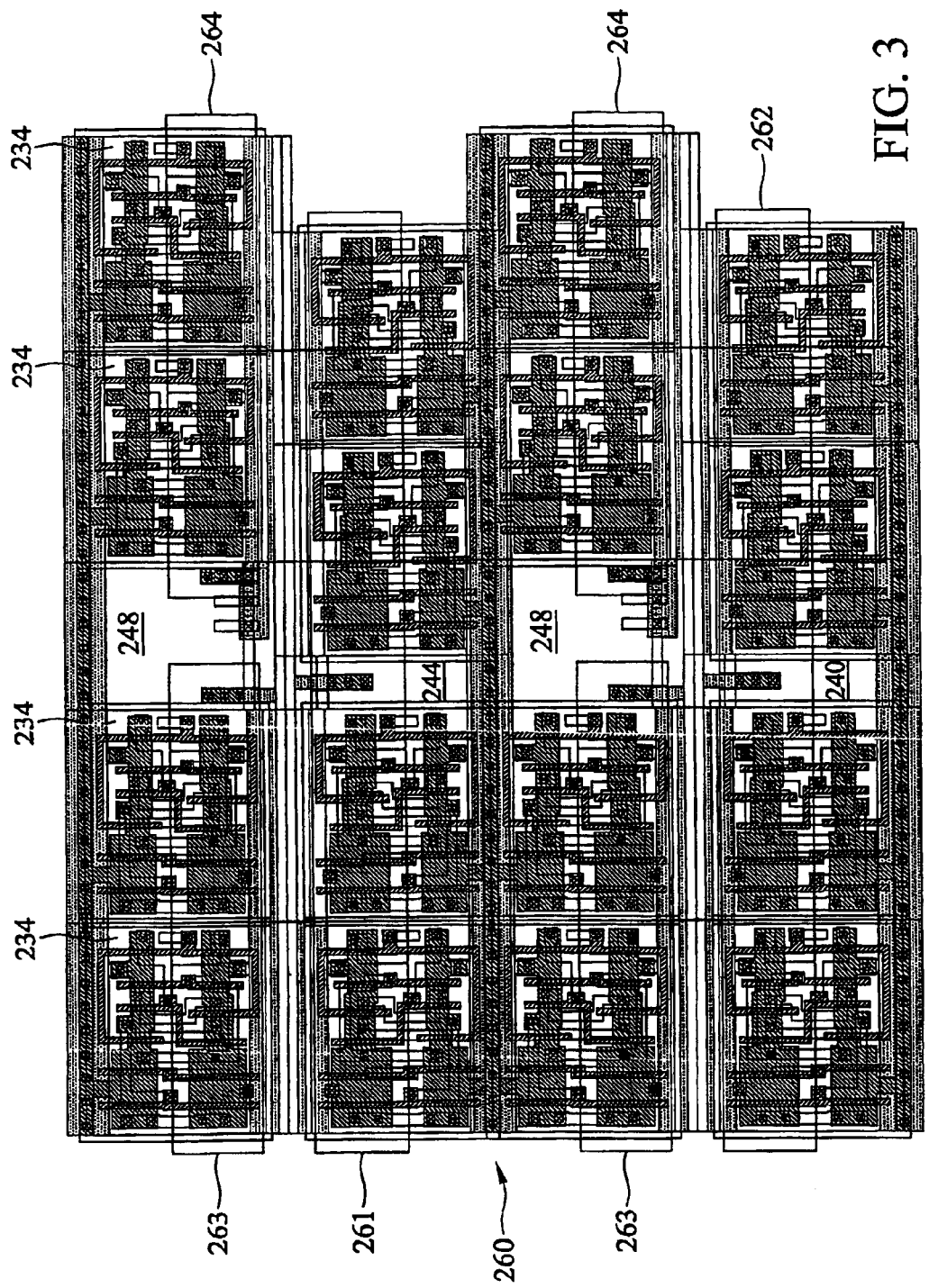
FIG. 3 shows four rows of a chip core floorplan in accordance with a second illustrative embodiment of the present invention.

FIG. 3 illustrates how the dual-VDD standard cells 234, 240, 244, and 248, of the dual-VDD standard cell library of the first illustrative embodiment may be placed in a core floorplan 260. Filler H/L cells 248 provide separation between nwell regions 263 and 264. In addition, the filler H/L cells 248 provide the nwell regions 263 and 264, with separate supply voltages VDDH and VDDL, respectively. The filler H cell 244 provides a high voltage VDDH to the nwell region 261. The Filler L cell 240 provides a low voltage VDDL to the nwell region 262.

Although the present invention and its advantages have been described in detail, it should be understood that various changes, substitutions and alterations can be made herein without departing from the spirit and scope of the invention as defined by the appended claims. For example, many of the features and functions discussed above can be implemented in software and hardware or a combination thereof. As another example, it will be readily understood by those skilled in the art that very fine-grain voltage island integrated circuit may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising:
    a logic cell without nwell contacts and comprising top and bottom voltage supply wires;
    a first filler cell comprising top and bottom voltage supply wires and an nwell region coupled to the bottom voltage supply wire;
    a second filler cell having an nwell region coupled to a top voltage supply wire; and
    a third filler cell comprising top and bottom voltage supply wires and comprising a pair of nwell regions, one of nwell regions being coupled to the top voltage supply wire and the other nwell region being coupled to the bottom voltage supply wire; the standard cell and the filler cells each comprising a place and route boundary (PRboundary) overlapping a top portion of the nwell region in each cell by a first distance.

2. The integrated circuit of claim 1, wherein the nwell regions of the third filler cell are horizontally separated by a second distance.

3. The integrated circuit of claim 2, wherein the first distance is half of the second distance.

4. The integrated circuit of claim 1, wherein the first distance is half of the minimum nwell spacing design rule for the semiconductor manufacturing process for which the standard library is designed.

5. The integrated circuit of claim 1, wherein the first filler cell further comprises a first power contact vertically separated from the first filler cell's bottom voltage supply wire, to which it is coupled.

6. The integrated circuit of claim 1, wherein the third filler cell further comprises a first power contact vertically separated from the third filler cell's bottom voltage supply wire, to which it is coupled.

7. The integrated circuit of claim 1, wherein the first and third filler cells both comprise a power contact coupled to the bottom voltage wire, the power contacts on the same metal layer.

8. A standard cell library comprising:
    a standard cell comprising first and second voltage supply wires in a top portion of the standard cell, comprising a top edge of an nwell region separated from a top edge of a place and route boundary (PRboundary) by a first distance, the nwell region not contacted with the first or the second voltage supply wires;
    a first filler cell comprising first and second voltage supply wires in a top portion of the first filler cell, and an nwell region coupled to the first voltage supply wire;
    a second filler cell comprising a voltage supply wire in a top portion of the second filler cell, and an nwell region coupled to the voltage supply wire; and
    a third filler cell comprising first and second voltage supply wires in a top portion of the second filler cell, comprising first and second nwell regions horizontally separated by a second distance, the first nwell region being coupled to the first voltage supply wire, the second nwell region being coupled to the second voltage supply wire.

9. The standard cell library of claim 8, wherein the first distance is about half of the second distance.

10. The standard cell library of claim 8, wherein the filler cells comprise a PRboundary, and a height of the PRboundary in the filler cells and in the standard cell is substantially coterminous.

11. The standard cell library of claim 8, further comprising a second standard cell substantially coterminous with the first standard cell with the exception of interconnected circuitry.

12. The standard cell library of claim 8, wherein the voltage supply wires are on the metal 1 layer.

13. A standard cell library comprising:
  a standard cell comprising:
    a first place and route boundary (PRboundary);
    a first voltage supply wire having a longitudinal center substantially aligned with a top edge of the first PRboundary;
    a second voltage supply wire inside the first PRboundary and aligned with the first supply wire in a top portion of the cell; and
    a first nwell region having a top edge separated from a top edge of the first PRboundary by half of an nwell spacing design rule, the first nwell region not coupled to the first or the second voltage supply wires;
  a first filler cell comprising:
    a second PRboundary and a third and fourth voltage supply wires configured substantially the same as the first PRboundary and the first and second voltage supply wires, respectively;
    a second nwell region coupled to the fourth voltage supply wire, the second nwell region having a top edge separated from the top edge of the third PRboundary by the first distance; and
    a first power contact wire two layers of metal above the third and fourth voltage supply wires, the fourth voltage supply wire being coupled to the power contact wire;
  a second filler cell comprising:
    a third PRboundary;
    a fifth voltage supply wire, the longitudinal center of the fifth voltage supply wire substantially aligned with a top edge of the third PRboundary; and
    a third nwell region coupled to the fifth voltage supply wire, the third nwell region having a top edge separated from the top edge of the third PRboundary by the half of the nwell spacing design rule; and
  a third filler cell comprising:
    a fourth PRboundary;
    a sixth and seventh voltage supply wire, the longitudinal center of the sixth voltage supply wire substantially aligned with a top edge of the fourth PRboundary; and
    fourth and fifth nwell regions horizontally separated by the nwell spacing design rule, the fourth and fifth nwell regions having a top edge separated from the top edge of the fourth PRboundary by half of the nwell spacing design rule, the fourth nwell region coupled to the sixth voltage supply wire, the fifth nwell region coupled to the seventh voltage supply wire.

* * * * *